(12) United States Patent
Bien

(10) Patent No.: US 6,388,525 B1
(45) Date of Patent: May 14, 2002

(54) AMPLIFIER WITH CONTROLLABLE VARIABLE SIGNAL GAIN

(75) Inventor: David Edward Bien, Glendale, AZ (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/772,033

(22) Filed: Jan. 29, 2001

(51) Int. Cl.[7] ................................................. H03G 2/12
(52) U.S. Cl. ........................................ 330/282; 330/284
(58) Field of Search ........................... 330/86, 136, 144, 330/282, 284

(56) References Cited

U.S. PATENT DOCUMENTS

| | | | | |
|---|---|---|---|---|
| 3,629,720 A | * | 12/1971 | Seclra | 330/86 |
| 4,499,430 A | * | 2/1985 | Fujii | 330/279 |
| 4,509,021 A | * | 4/1985 | van Udeu | 330/282 |
| 5,138,280 A | * | 8/1992 | Gingrich et al. | 330/295 |
| 5,175,508 A | * | 12/1992 | Gingrich et al. | 330/84 |

\* cited by examiner

*Primary Examiner*—Michael B Shingleton
(74) *Attorney, Agent, or Firm*—Wildman, Harrold, Allen & Dixon

(57) ABSTRACT

A linear amplifier with a variable signal gain controlled by a control signal that is externally generated and based on the magnitude of the incoming signal. A shunt impedance is connected at the input of the amplifier and a feedback impedance is connected between the output and input of the amplifier. The amplifier is an inverting amplifier, thereby making the output signal phase inverse to the input signal phase. Both impedances are variable and are controlled by the control signal. Together, the signal gain of the amplifier and the values of the shunt and feedback impedances determine the overall signal gain of the circuit.

15 Claims, 5 Drawing Sheets

AMPLIFIER WITH CONTROLLABLE VARIABLE SIGNAL GAIN

BACKGROUND OF THE INVENTION

1. Field of the Invention

The field of the present invention is electronic amplifier circuits. More particularly, the present invention relates to a variable gain amplifier circuit.

2. Description of the Related Art

Wireless devices are transforming how people work, relax, and communicate. These devices can enable convenient access to informational, educational, and entertainment data, and provide a convenient portal for worldwide communication. Some of the most popular wireless devices are portable, which benefit not only from a small footprint, but also require a consistent and robust communication link to be useful. Without the benefit of such a dependable communication link, users are unable to reasonably rely on the availability of their wireless devices.

Generally, a wireless device has a radio transceiver that communicates with other mobile devices or to a more permanent base station. Accordingly, the wireless device has an antenna that is used to both transmit and receive radio frequency signals. In particular, the antenna and wireless device are typically configured to operate on a particular range of radio frequencies, with an information signal modulated on the radio wave.

It is a particularly difficult problem to configure a wireless device to reliably and robustly receive signals in a manner that enables the information signal to be consistently demodulated and used. Several factors affect the quality of reception and the usability of the information signal. For example, the modulation signal may be subjected to physical interferences, such as buildings, that substantially attenuate the modulation signal. Further, distance from the modulation signal source also substantially attenuate the modulation signal. To facilitate receiving an attenuated signal, the wireless device will often attempt to amplify the modulated signal to a usable level. However, such amplification not only amplifies the modulated signal and information signal, but also amplifies noise and disturbances. Accordingly, the signal to noise ratio of the modulated signal deteriorates until the information signal is indiscernible from the noise.

Amplifiers used in wireless devices often operate in a substantially linear fashion. This is particularly true for the receiver section where any non-linearities introduced during processing of the incoming signal can produce distortion products that will interfere with the accurate reception and demodulation of the incoming information signal. Such distortion products will produce errors within the received signal information. In wireless applications, the receiver section must typically deal with a wide range of incoming signal levels and such a wide range can create some conflicting requirements for the amplifier. For example, for weak signals the amplifier should provide significant gain, often in the range of 12–16 decibels (dB) but do so without adding excessive noise to the signal. This helps preserve the signal-to-noise ratio (SNR) through the receiver section and allows the received signal to be recovered without errors due to excessive noise. However, because the amplifier is providing such significant gain, stronger received signals can easily overload the amplifier or subsequent stages within the receiver section and thereby cause significant errors because of distortion products.

Implementing an amplifier that can handle the largest received signal without distortion requires the amplifier to be capable of a high-power output. This is generally in direct conflict with a requirement for low power consumption that is necessary for hand-held devices which are typically powered by batteries. (The noise level is less problematic in the presence of a strong signal where the strength of the received signal is such that it can be recovered notwithstanding the noise level. In these instances, noise performance can be sacrificed for improved linearity.)

The popularity and interoperability of wireless devices is enhanced by communications standards. Accordingly, most wireless devices adhere to one of the handful of common communications standards. Some of these standards, such as the widely popular CDMA (Code Division Multiple Access) standard, benefit from a variable gain amplifier. Indeed, in CDMA, for example, the gain of the transmitter amplifier is continually adjusted to the minimum operating power. Accordingly, the wireless device is often receiving only a very small modulation signal. Although this provides superior channel separation in a CDMA system, the amplifier arrangement must be configured to a high sensitivity. However, such a setting may leave the wireless device susceptible to spikes, surges or other forms of large changes in the modulation signal. If a large signal causes the wireless device to saturate, then the wireless device may drop a communication or be damaged.

For the best signal recovery in CDMA wireless receiver devices, the receiver section characteristics are modified as the signal levels change within the received signal. The ability to receive weak signals without adding excessive noise and the ability to receive strong signals can be managed by controlling the characteristics of the first amplifier following the antenna within the receiver section. If such amplifier has a suitable, variable attenuation device built into the amplifier circuit, then the extremes of signal strength can be accommodated. For example, with such attenuation set to zero, the gain of the section is maximized as is the ability to receive weak signals. For strong signal levels, such attenuation must be increased above zero, thereby reducing the effective gain of the amplifier section. However, this has the advantageous effect of reducing the maximum signal level that the amplifier section, as well as subsequent stages, must process. As a result, the effective signal range in which the amplifier remains operating in a linear fashion is increased, with respect to the input port to the receiver section.

In achieving the best performance characteristics when processing small signals as well as large signals, such a variable attenuator, as part of the amplifier circuitry, will be required to have a number of characteristics. When the attenuator is set for zero attenuation, it should function as a "straight through" device, i.e., it should introduce no signal loss and should not adversely affect the noise performance of the amplifier section (e.g., by loading the input port of the amplifier and thereby changing its input impedance).

Additionally, when the attenuator is set to provide some amount of signal attenuation, it should have no adverse effect on the operation of the amplifying device. Such adverse effects would include changes introduced to the biasing conditions of the amplifier or the introduction of some signal distortion characteristic that is not otherwise present during operation of the amplifier.

Further, the attenuator should provide effective attenuation at the input of the amplifier so that the maximum output required at the output of the amplifier is sufficiently reduced when such attenuation is provided. Moreover, the attenuator should introduce no excess noise so as to exacerbate the degradation in SNR that is otherwise inherently introduced with attenuation, nor should the attenuator introduce any significant non-linear operating characteristics during operation at any of its levels of attenuation.

SUMMARY OF THE INVENTION

An amplifier circuit with shunt and feedback impedance circuits for providing a controllable variable signal gain in accordance with one embodiment of the present invention includes: an input signal terminal; an output signal terminal; a signal reference terminal; a shunt impedance circuit; a feedback impedance circuit; and an amplifier circuit. The input signal terminal is for conveying an input signal having an input signal magnitude and phase. The output signal terminal is for conveying an output signal having an output signal magnitude and phase. The signal reference terminal is for establishing a signal reference node. The shunt impedance circuit is coupled between the input signal terminal and the signal reference terminal and has a shunt impedance that varies in response to reception of a control signal. The feedback impedance circuit is coupled between the input and output signal terminals and has a feedback impedance that varies in response to reception of the control signal. The amplifier circuit, coupled between the input and output signal terminals, has an associated amplifier signal gain and provides the output signal in response to reception of the input signal, wherein the output signal phase is inverse to the input signal phase and a ratio of the output and input signal magnitudes varies in relation to a circuit signal gain. The amplifier signal gain, the shunt impedance and the feedback impedance together determine the circuit signal gain.

DETAILED DESCRIPTION OF THE INVENTION

In accordance with the present invention, a combination of voltage variable impedance elements, which can be implemented using metal oxide semiconductor field effect transistors (MOSFETs), is used to create an equivalent voltage variable shunt impedance at the input of an amplifier circuit, thereby introducing a voltage variable signal gain for the stage as a whole. Such an equivalent shunt input impedance is actually achieved using a combination of a voltage variable impedance connected between the input terminal and signal reference, or ground, plus another voltage variable impedance connected between the input terminal and a terminal within the output stage at which the signal has a phase opposite to the input signal. Such a circuit configuration allows large attenuation values at the input to be achieved while using physically smaller shunt elements. This reduces the amount of parasitic loading of the input terminal, while still providing a wide range of overall circuit gain control.

Figure 1:
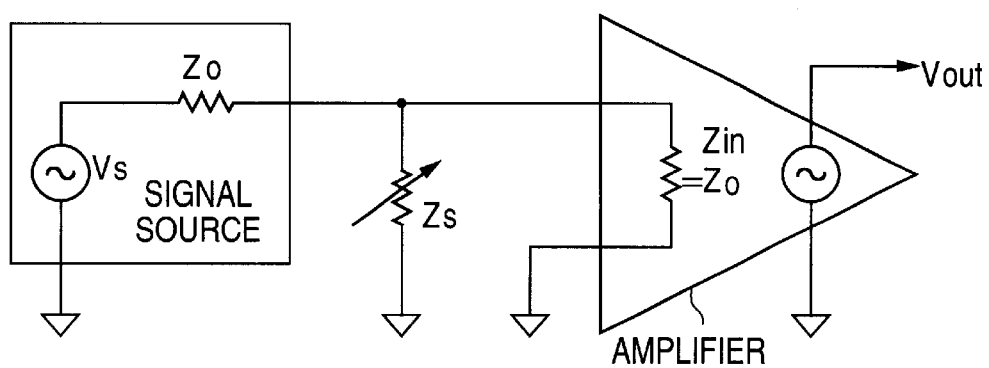
FIG. 1 is a schematic diagram of conventional circuit model for describing the operation of the simple shunt attenuator.

Referring to FIG. 1, the presently claimed invention can perhaps be best understood by beginning with a simple analysis of achieving attenuation by using a shunt input attenuator. A signal source provides a voltage signal Vs with a signal source output impedance of Zo to an amplifier having an input impedance Zin equal to such impedance Zo. A shunt attenuator, in the form of shunt impedance Zs, introduces attenuation at the input terminal of the amplifier. A conventional analysis of this circuit will indicate that the attenuation At of the signal at the input terminal of the amplifier will be a function of the characteristic impedance Zo (typically equal to 50 ohms in communication applications) and the value Zs of the shunt impedance as follows:

$$At(dB)=20 \log (1+Zo/(2*Zs))$$

Impedances Zo and Zs are often complex (i.e., include inductive or capacitive components, in addition to a resistive component), but for a first order approximation of the range of impedance Zs required for a specific range of attenuation At, only resistive impedances will be considered for purposes of the following table. Assuming that Zo equals 50 ohms, as is typical for communication applications, then examples of attenuation for specific shunt impedances Zs are as follows:

| Desired Attenuation (dB) | Zs (ohms) |
| --- | --- |
| 0.0 | Infinite |
| 0.1 | 2159 |
| 1.0 | 205 |
| 3.0 | 60.6 |
| 10.0 | 11.6 |
| 30.0 | 0.816 |
| Infinite | 0.0 |

Referring to the table above, it can be seen that an attenuation change from less than 0.1 dB to 30 dB requires a change in shunt impedance Zs by a factor of more than 2500. This is a typical range for a wireless CDMA application. Finding a way to implement the variable impedance Zs with such a required range is difficult in conventional integrated circuits.

Typically, the impedance element Zs is implemented using a MOSFET. With a gate-to-source voltage Vgs that is below its threshold value Vt, the MOSFET conducts virtually zero DC current and presents a relatively high impedance between its drain and source terminals, while a gate-to-source voltage Vgs that is above the threshold value Vt causes the formation of a conductive channel between the drain and source terminals. This channel conductance is dependent upon many factors, including the physical size (i.e., the width of the channel) of the device, the gate-tosource voltage Vgs, and other parameters that are, in turn, dependent upon the fabrication processes used to manufacture the device. Achieving a sufficiently low channel resistance to provide for high attenuation requires using a relatively large MOSFET device. As the device becomes larger, its corresponding channel resistance becomes lower. However, a large device has disadvantages in terms of the integrated circuit die area required and related cost of manufacturer, as well as larger parasitic capacitances. Large parasitic capacitances reduce the AC, or signal, impedance of the device and may prevent the minimum attenuation goal from being achieved, particularly at higher frequencies where effects of parasitic capacitances become more pronounced.

For example, achieving a minimum attenuation of 0.1 dB requires that the net parasitic capacitance of the shunt impedance, i.e., between the input terminal and signal ground, be below 100 femtofarads. Given the normal variations in die sizes, supply voltages, and fabrication processes, it is likely difficult if not impossible to achieve this required range of impedances needed for such a range of attenuation.

Figure 2A:
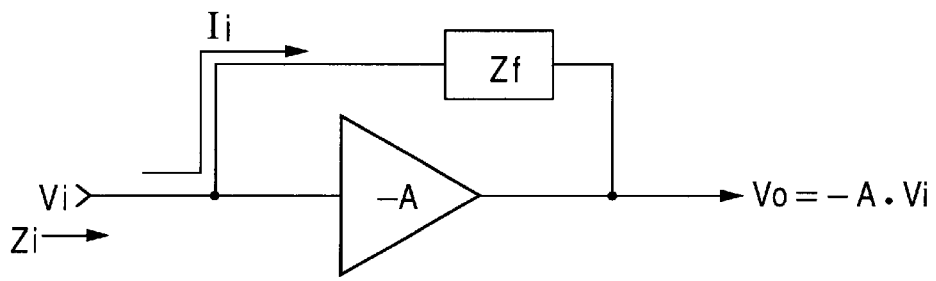
FIGS. 2A and 2B are functional block diagrams of conventional circuit models used to describe the simulation of a shunt-input impedance using active circuitry.
Figure 2B:
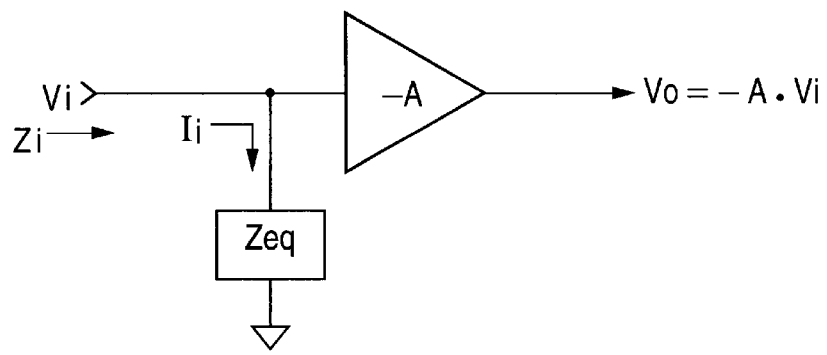

Referring to FIGS. 2A and 2B, the aforementioned problems associated with using an input shunt impedance can be solved, at least in part, by using an active gained stage with a feedback impedance. Referring to FIG. 2A, the input current Ii and the resulting circuit input impedance Zi (it is assumed that the input impedance of the amplifier, which has a gain of −A, is sufficiently high as to have a negligible effect on the surrounding circuitry) of the circuit can be computed as follows:

$$Ii=(Vi+A*Vi)/Zf$$

$$Zi=Vi/Ii=Zf/(1+A)=Zeq$$

Referring to FIG. 2B, the equivalent circuit has a shunt input impedance having an equivalent impedance of Zeq that determines the input impedance Zi. In the circuit of FIG. 2A, the shunt impedance is not returned to a reference, or ground, node in the circuit, but is, instead, returned to the output of the gain stage. Conventional analysis shows that the effective input impedance will depend upon the respective values of the input Vi and output Vo voltages, as well as the gain A. Hence, the equivalent input impedance is reduced by a factor of 1+Av (where Av is the voltage gain of the gain stage). As will be discussed in more detail below, in one embodiment of the present invention, the shunt impedance is returned to a point in a cascode amplifier where the gain is equal to a negative unity, thereby making the voltage at the output equal in amplitude, but opposite in phase to the phase of the voltage at the input. In such case, the effective input impedance is Zf/2.

This type of circuit configuration is advantageous in that a low impedance, which is needed for maximum attenuation, can be achieved while using a smaller MOSFET device. On the other hand, the ability to achieve maximum impedance (for minimum attenuation) is virtually unaffected. As noted earlier, obtaining large impedances is less difficult, since operating a MOSFET below its threshold bias voltage Vt can produce a channel resistance well in excess of 1 billion ohms. Instead, the maximum impedance, particularly at higher frequencies, will be limited by parasitic elements of the MOSFET device. However, as these parasitic capacitances are primarily returned to signal ground points in this feedback impedance configuration, their effects are not multiplied in the same manner as the channel resistance. Hence, for a given size MOSFET device, a wider gain control range can be achieved.

Figure 3A:
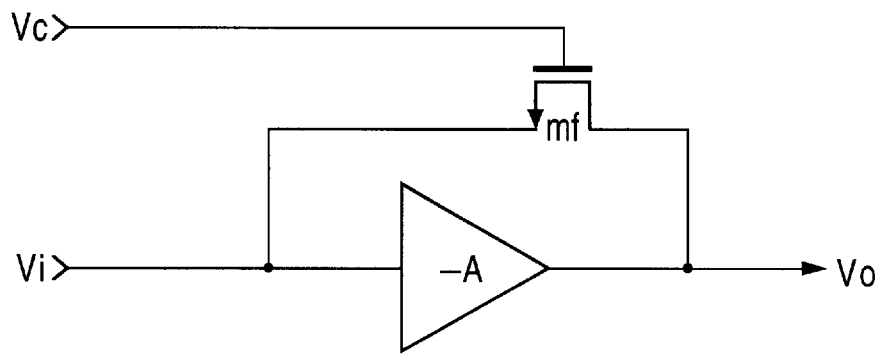
FIGS. 3A and 3B are schematic diagrams of one example of a circuit using an active feedback circuit for simulating an input shunt impedance.
Figure 3B:
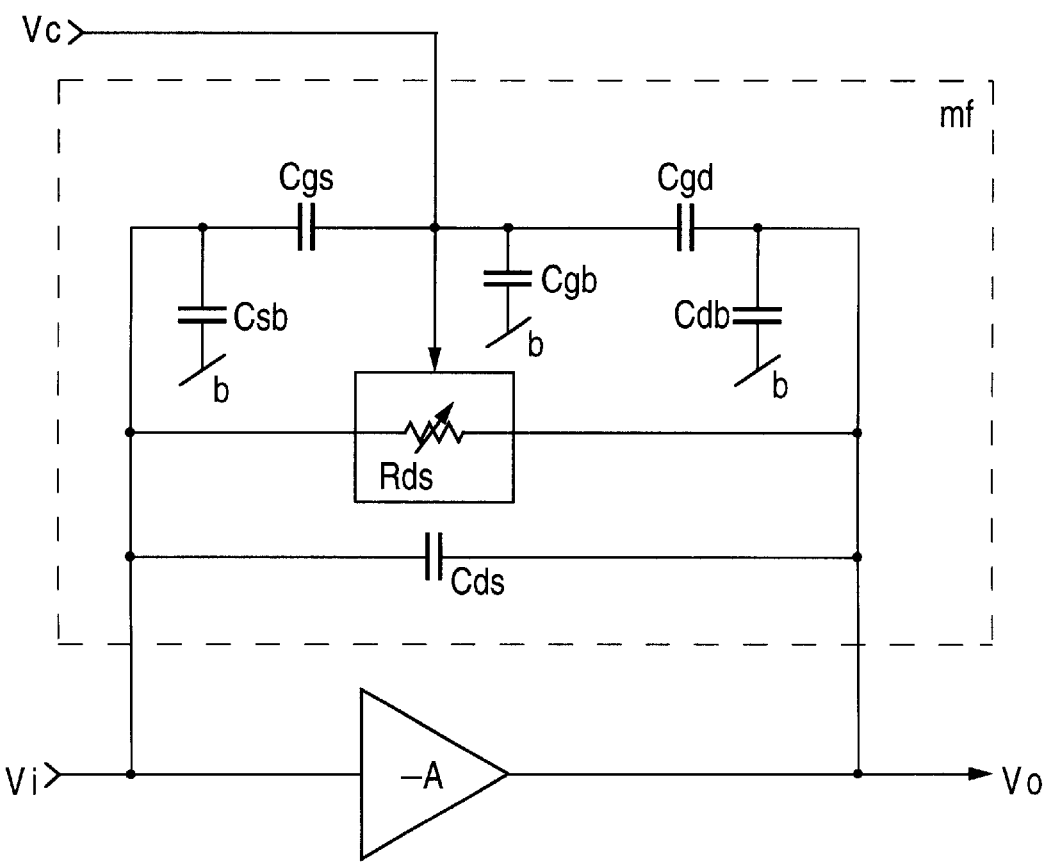

Referring to FIGS. 3A and 3B, the aforementioned parasitic capacitances and their possible, albeit minimal, effects on the feedback impedance can be better understood. Referring to FIG. 3A, as discussed, a MOSFET Mf can be used as the feedback impedance element and controlled by a control voltage Vc to vary the impedance, i.e., the channel resistance of the device.

Referring to FIG. 3B, as is well known in the art, such a feedback device Mf has a number of parasitic capacitance associated with it, in addition to the channel resistance Rds. In the small signal model depicted, these parasitic capacitances include those between the drain and source terminals Cds, between the gate and source terminals Cgs, and between the gate and drain terminals Cgd. Also included are capacitances between the substrate, or bulk, and the source terminal Csb, gate terminal Cgb, and drain terminal Cdb.

As shown, the channel resistance Rds is the only impedance element that is subject to modification or scaling as discussed above. The capacitances are all returned to either signal (AC) ground or circuit ground (the bulk region is typically connected to circuit ground), so they are not scaled by the gain of the active gain stage. On the other hand, however, the drain-to-source capacitance Cds would be effected. However, such capacitance Cds is typically quite small for a MOSFET device and is often not included in small signal models.

Therefore, it can be seen that the range of attenuation can be extended by extending the effective range of impedances on the part of the MOSFET device, since the variable channel resistance is scaled down by the gain of the active gain stage, thus reducing the minimum impedance while not changing the effects of the parasitic capacitance elements. Accordingly, the maximum impedance will remain extremely high.

Figure 4:
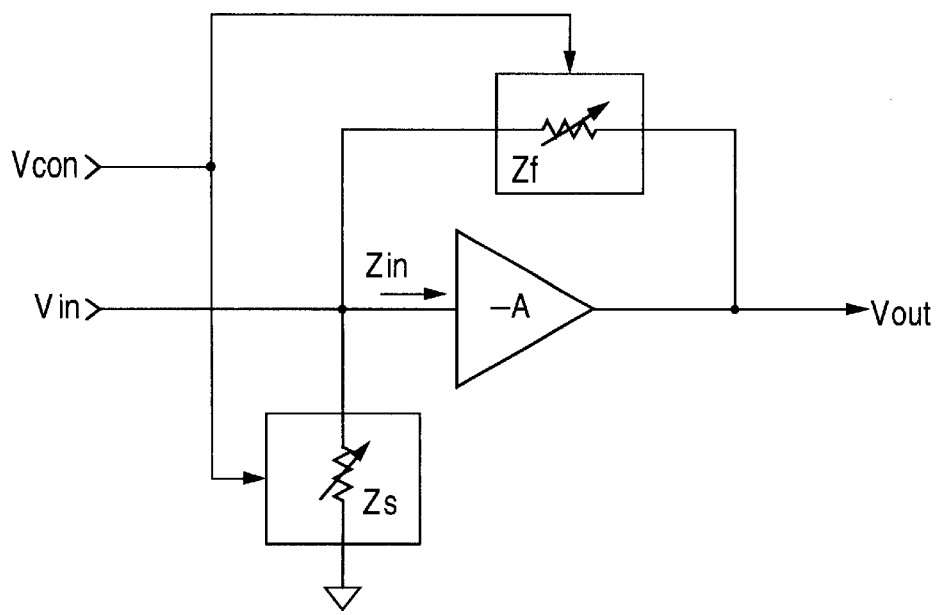
FIG. 4 is a functional block diagram of an amplifier circuit with shunt and feedback impedance circuits for providing a controllable variable signal gain in accordance with one embodiment of the present invention.
Figure 5:
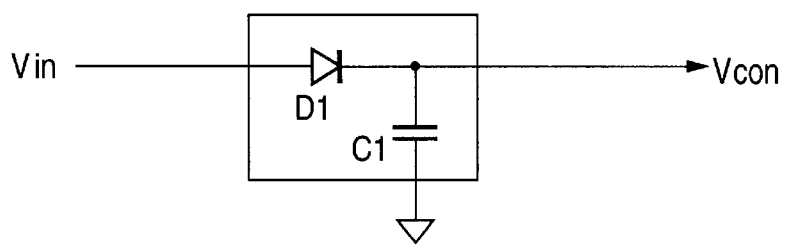
FIG. 5 is a schematic diagram of one example of a circuit for generating the control voltage used in the circuit of FIG. 4.

Referring to FIG. 4, an amplifier circuit with a wide range of variable gain that uses shunt and feedback impedances in conjunction with an active gain stage in accordance with the present convention includes an active gain stage having an inverting voltage gain of −A, a variable input shunt impedance Zs and a variable feedback impedance Zf, all interconnected substantially as shown. The input voltage Vin is amplified by the circuit to produce the output voltage Vout, with the overall gain (or attenuation, depending on one's perspective) determined by the absolute value of the voltage gain A and the respective values of the shunt Zs and feedback Zf impedances. These impedances are controlled by a control voltage Vcon.

The control voltage Vcon is derived as a function of the magnitude of the input voltage Vin so as to control the overall circuit gain to prevent saturation and distortion from occurring within this circuit stage as well as later circuit stages. By way of example, although other ways to derive this control voltage Vcon will be readily apparent to one of ordinary skill in the art, is to simply rectify the input signal voltage Vin using a series diode D1 and shunt capacitor C1 for filtering, thereby producing a DC control voltage Vcon.

Figure 6:
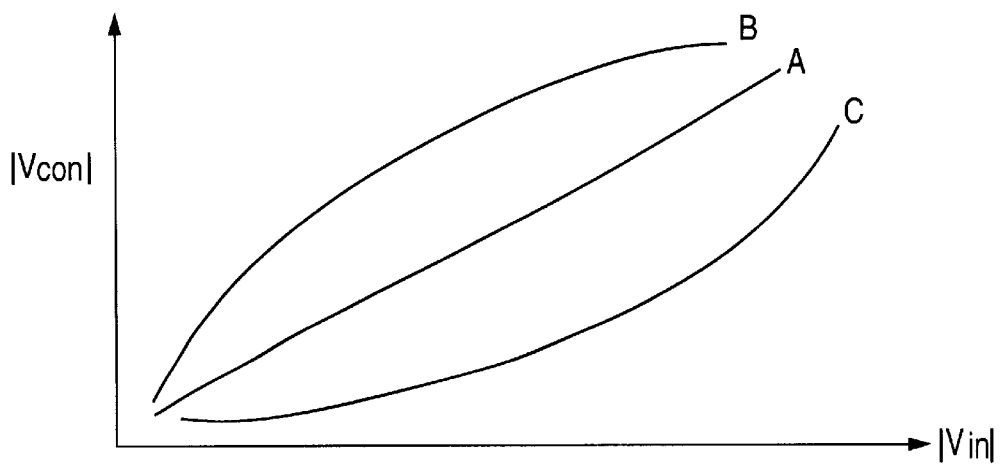
FIG. 6 is a graph illustrating examples of possible relationships between the control voltage and input signal voltage for the circuit of FIG. 4.

Referring to FIG. 6, depending upon the desired controlling effect, the magnitude of the control voltage Vcon can be derived as a function of the magnitude of the input signal voltage Vin to produce a number of different control voltage Vcon versus input signal voltage Vin transfer functions or gain profiles. For example, a linear relationship can be established as depicted by plot line A, or various forms of non-linear relationships can be established as depicted by plot lines B and C.

Figure 7:
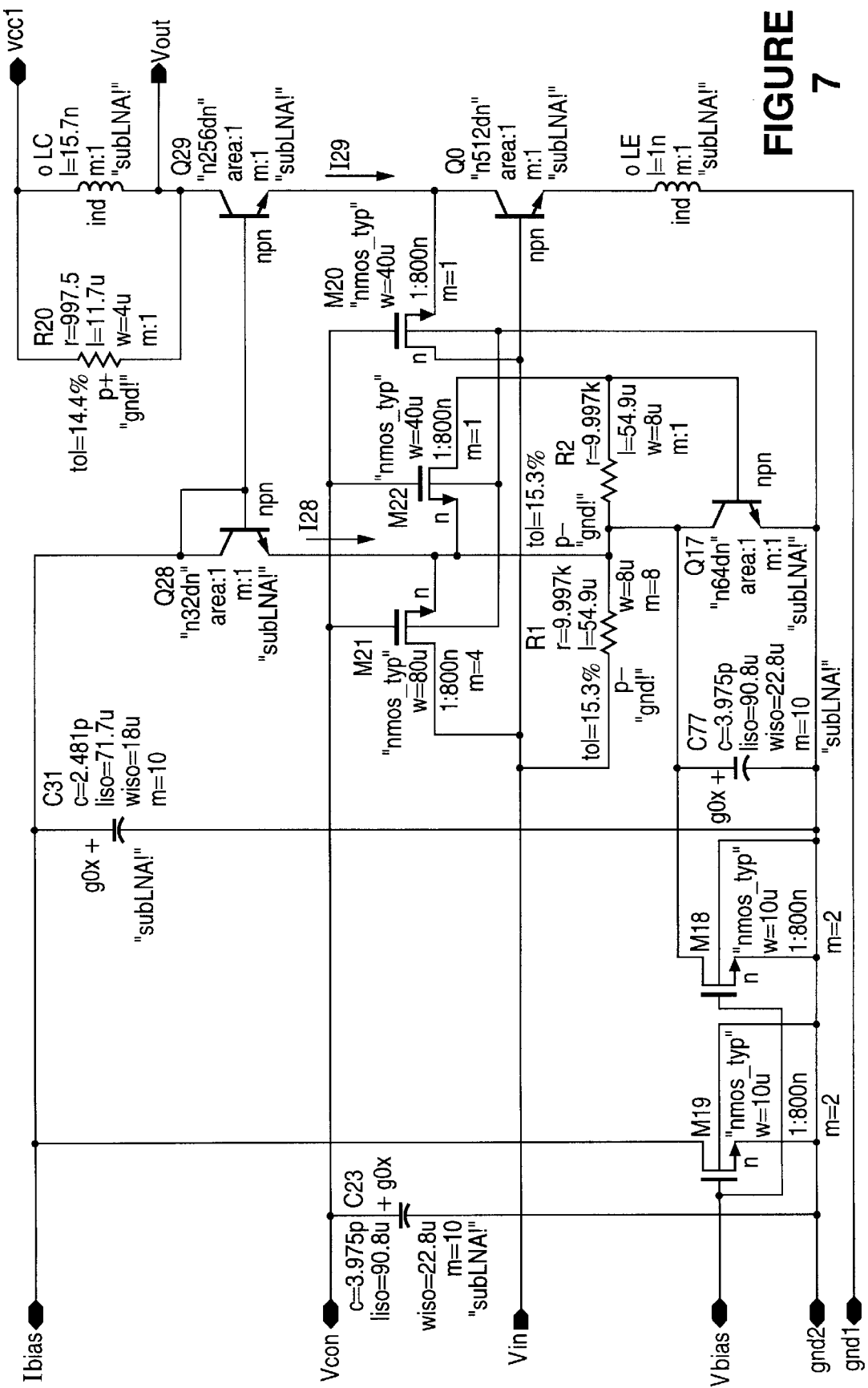
FIG. 7 is a schematic diagram of one possible embodiment of the circuit of FIG. 4.

Referring to FIG. 7, one example of an implementation of the circuit of FIG. 4 includes NPN bipolar junction transistors Q17, Q28, Q29, Q0, N-MOSFETs M19, M18, M21, M22, M20, resistors R1, R2, R20, capacitors C23, C31, C77, and inductive elements LC, LE, interconnected substantially as shown. A bias current Ibias is provided to drive the current mirror circuit formed by transistors Q28 and Q29, thereby establishing an input bias current I28 and output bias current I29 for the amplifier formed by transistor Q0. A bias voltage Vbias is used to bias transistors M19 and M18 both in either off or on states, thereby enabling or disabling operation of the circuit. The input signal voltage Vin drives the amplifier transistor Q0, and the control voltage Vcon is used to control the channel resistances of transistors M21 and M20 (which serve as the shunt and feedback impedance elements, respectively, as discussed in more detail below) and transistor M22 (which serves as a bias compensation device, as discussed in more detail below). The output signal generated by transistor Q0 is buffered by cascode transistor Q29 to produce the output voltage Vout across the load elements R20, LC.

Feedback transistor M20 provides a controllable variable feedback impedance (Zf) between the input and output of the amplifier formed by transistor Q0. As should be evident from this connection, this causes the output signal of transistor Q0 at its collector terminal (and at the source terminal of transistor M20) to have a signal phase that is inverse to the signal phase at the input of transistor Q0 at its base terminal (and at the drain terminal of transistor M20). Therefore, in accordance with the foregoing discussion, this feedback transistor M20 provides feedback in the form of a variable attenuated signal, thereby attenuating the magnitude of the input signal voltage Vin at the base terminal of transistor Q0.

While the use of feedback transistor M20 has the desirable effect of providing some attenuation of the input signal Vin, such use must be limited. In other words, merely increasing the size of transistor M20 to increase the amount of possible attenuation would have a negative effect on the linearity of the amplification provided by transistor Q0. Accordingly, transistor M21 is used to provide a shunt impedance at the input as well.

Shunt impedance transistor M21 is connected between the input, i.e., and the base terminal of transistor Q0, and AC, or signal, ground via coupling capacitor C77. Hence, this transistor M21 serves as a shunt impedance for the input signal Vin. Hence, in accordance with the magnitude of the control voltage Vcon, transistor M21 provides a shunt impedance at the input to provide additional control over the amount of attenuation of the magnitude of the input signal Vin.

Unlike the feedback transistor M20, shunt transistor M21 has a negligible effect upon the linearity of the operation of the amplifier transistor Q0. However, simply increasing the size of transistor M21 to further increase the potential range of attenuation is not desirable due to the simultaneous increase in parasitic capacitance introduced by such larger device sizes. Rather, by using the feedback transistor M20 and shunt transistor M21 together, a wide range of attenuation can be provided while maintaining linearity of the signal amplification and minimizing effects from parasitic capacitances.

Transistor M22 is used to preserve DC bias for the amplifier transistor Q0. One effect of the variable impedance of shunt transistor M21 is to draw away bias current from the amplifier transistor Q0. Bias transistor M22 tracks this bias condition and compensates for any loss in bias current through transistor M21. More particularly, bias transistor M22 drives the base of transistor Q17 which, in turn, adjusts the bias current for the amplifier transistor Q0.

Figure 8:
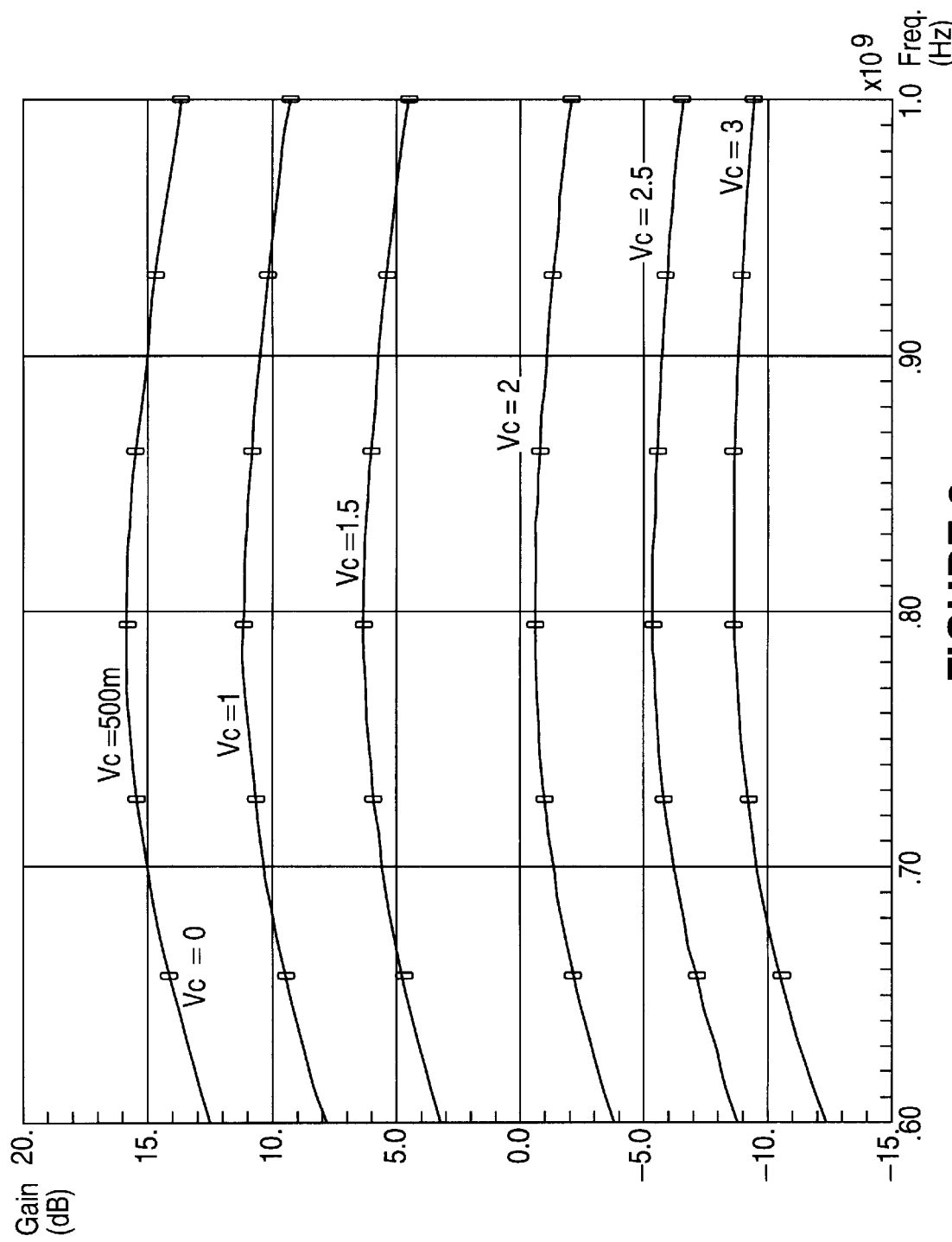
FIG. 8 is a graph illustrating simulation results for the circuit of FIG. 7 in which the signal gain is varied in relation to the control voltage.

Referring to FIG. 8, a simulation of the circuit of FIG. 7 was conducted and the range of gain values for this circuit over the frequency range of 600 megahertz through 1 gigahertz was as shown. For control voltage Vcon with values between 0 and 3 volts, the peak gain values range from approximately 16 dB through −9 dB.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an amplifier circuit with shunt and feedback impedance circuits for providing a controllable variable signal gain, comprising:

an input signal terminal for conveying an input signal having an input signal magnitude and phase;

an output signal terminal for conveying an output signal having an output signal magnitude and phase;

a signal reference terminal for establishing a signal reference node;

a shunt impedance circuit coupled between said input signal terminal and said signal reference terminal and having a shunt impedance that varies in response to reception of a control signal;

a feedback impedance circuit coupled between said input and output signal terminals and having a feedback impedance that varies in response to reception of said control signal; and an amplifier circuit, coupled between said input and output signal terminals, that has an associated amplifier signal gain and provides said output signal in response to reception of said input signal, wherein said output signal phase is inverse to said input signal phase and a ratio of said output and input signal magnitudes varies in relation to a circuit signal gain;

wherein said amplifier signal gain, said shunt impedance and said feedback impedance together determine said circuit signal gain.

2. The apparatus of claim 1, wherein said signal reference terminal comprises a circuit reference terminal.

3. The apparatus of claim 1, further comprising:
   a circuit reference terminal; and
   a capacitive circuit coupled between said signal reference terminal and said circuit reference terminal.

4. The apparatus of claim 1, further comprising:
   a circuit reference terminal; and
   a capacitive circuit element with a capacitance having first and second opposing terminals, wherein said first terminal is connected to said circuit reference terminal and said second terminal forms said signal reference terminal.

5. The apparatus of claim 1, wherein said amplifier circuit comprises a transistor with a transistor input terminal coupled to said input signal terminal and a transistor output terminal coupled to said output signal terminal.

6. The apparatus of claim 1, wherein said shunt impedance circuit comprises a transistor with a current path having a conductivity that varies in response to reception of said control signal.

7. The apparatus of claim 6, wherein first and second opposing ends of said transistor current path are coupled to said input signal terminal and said signal reference terminal, respectively.

8. The apparatus of claim 1, wherein said shunt impedance circuit comprises:
- a transistor with a current path having a conductivity that varies in response to reception of said control signal; and
- a capacitive circuit element coupled to said transistor.

9. The apparatus of claim 8, wherein said transistor and said capacitive circuit element are coupled in series.

10. The apparatus of claim 1, wherein said feedback impedance circuit comprises a transistor with a current path having a conductivity that varies in response to reception of said control signal.

11. The apparatus of claim 10, wherein first and second opposing ends of said transistor current path are coupled to said input signal terminal and said output signal terminal, respectively.

12. The apparatus of claim 1, further comprising a biasing circuit, coupled to said input signal terminal, that provides a predetermined dc bias to said input signal terminal in response to reception of said control signal.

13. The apparatus of claim 1, further comprising a biasing circuit, coupled across said shunt impedance circuit, that provides a predetermined dc bias to said input signal terminal in response to reception of said control signal.

14. An apparatus including an amplifier circuit with shunt and feedback impedances for providing a controllable variable signal gain, comprising:

input signal means for conveying an input signal having an input signal magnitude and phase;

output signal means for conveying an output signal having an output signal magnitude and phase;

signal reference means for establishing a signal reference node;

shunt impedance means for receiving a control signal and in response thereto providing a variable shunt impedance between said input signal means and said signal reference means;

feedback impedance means for receiving said control signal and in response thereto providing a variable feedback impedance between said input and output signal terminals; and amplifier means with an associated amplifier signal gain for receiving said input signal and in response thereto providing said output signal, wherein said output signal phase is inverse to said input signal phase and a ratio of said output and input signal magnitudes varies in relation to a circuit signal gain;

wherein said amplifier signal gain, said shunt impedance and said feedback impedance together determine said circuit signal gain.

15. The apparatus of claim 14, further comprising biasing means for receiving said control signal and in response thereto generating a predetermined dc bias at said input signal terminal.

* * * * *